United States Patent
Corsi

[19]

[11] Patent Number: 6,084,477
[45] Date of Patent: Jul. 4, 2000

[54] CLASS AB OUTPUT STAGE FOR AN AUDIO POWER AMPLIFIER

[75] Inventor: Marco Corsi, Plano, Tex.

[73] Assignee: Texas Instruments Incorporated, Dallas, Tex.

[21] Appl. No.: 09/015,411

[22] Filed: Jan. 29, 1998

[51] Int. Cl.[7] ........................................... H03F 3/30
[52] U.S. Cl. ............................................... 330/264
[58] Field of Search .................... 330/300, 264, 330/269

[56] References Cited

U.S. PATENT DOCUMENTS

| | | | |
|---|---|---|---|
| 4,336,503 | 6/1982 | Whatley | 330/264 |
| 4,482,868 | 11/1984 | Whatley | 330/300 |
| 5,491,448 | 2/1996 | Naokawa et al. | 330/264 |
| 5,703,533 | 12/1997 | Nebel et al. | 330/300 |

Primary Examiner—Robert Pascal
Assistant Examiner—Patricia T. Nguyen
Attorney, Agent, or Firm—Alan K. Stewart; Wade James Brady, III; Richard L. Donaldson

[57] ABSTRACT

An output stage of an amplifier circuit includes a sinking bipolar circuit 22 for sinking current from an external load 12; a sourcing MOS transistor 14 for sourcing current to the external load 12, a source of the MOS transistor 14 coupled to the sinking bipolar circuit 22 to form a common output node 34; a mirroring MOS transistor 16 having a gate coupled to a gate of the sourcing MOS transistor 14 such that current in the sourcing transistor 14 approximately mirrors current in the mirroring transistor 16; and a current mirror circuit 39 responsive to the mirroring transistor 16 and coupled to control current flow through the sinking bipolar circuit 22.

8 Claims, 1 Drawing Sheet

CLASS AB OUTPUT STAGE FOR AN AUDIO POWER AMPLIFIER

This application claims priority under 35 USC §119 (e)(1) of provisional application No. 60/036,529, filed Jan. 30, 1997.

FIELD OF THE INVENTION

This invention generally relates to electronic systems and in particular it relates to an amplifier output stage.

BACKGROUND OF THE INVENTION

Many electronic circuits use amplifiers to manipulate various signals within the circuit. The output of the amplifier may be connected to provide an output voltage to a load circuit. The design of the output stage may affect various operating aspects of the amplifier. For example, some amplifiers can deliver a high output current to the load. Other amplifiers can produce an output voltage swing that is approximately equal to the magnitude of the power supply for the amplifier circuit. Some amplifiers must provide an output that has a low crossover distortion. Yet other amplifiers are required to maintain gain and stability at relatively high frequencies. Each of these requirements places constraints upon the design of the output stage.

During operation, an amplifier circuit consumes current from a power supply. A portion of this current, known as the quiescent current, is used to bias the internal circuitry of the amplifier. A low quiescent current is desirable because it reduces the power consumption when the amplifier is operating at a light load, or with no load at all.

Previously developed amplifier output circuits have addressed some of these problems. For example, output circuits commonly referred to as class A circuits provide low output distortion. Unfortunately, class A circuits inherently consume large amounts of quiescent current. A second class of output circuits is referred to as class B circuits. These circuits consume very little quiescent current. However, class B circuits exhibit substantial crossover distortion. A hybrid of the class A and Class B output circuits is commonly referred to as class AB output circuits. Class AB circuits consume more quiescent current than equivalent class B circuits, but less quiescent current than equivalent class A circuits. As a result, they exhibit less crossover distortion than class B circuits but more crossover distortion than class A circuits.

Most amplifiers use class AB output circuits so as to achieve reasonable crossover distortion levels with a quiescent current of perhaps five to ten percent of the maximum allowable output current. These circuits typically have difficulty in achieving significantly lower levels of quiescent current. In addition, many prior amplifier circuits rely upon circuits which reduce the available frequency response to reduce the quiescent current.

SUMMARY OF THE INVENTION

Generally, and in one form of the invention, the output stage of an amplifier circuit includes a sinking bipolar circuit for sinking current from an external load; a sourcing MOS transistor for sourcing current to the external load, a source of the MOS transistor coupled to the sinking bipolar circuit to form a common output node; a mirroring MOS transistor having a gate coupled to a gate of the sourcing MOS transistor such that current in the sourcing transistor approximately mirrors current in the mirroring transistor; and a current mirror circuit responsive to the mirroring transistor and coupled to control current flow through the sinking bipolar circuit.

DETAILED DESCRIPTION OF PREFERRED EMBODIMENTS

Figure 1:
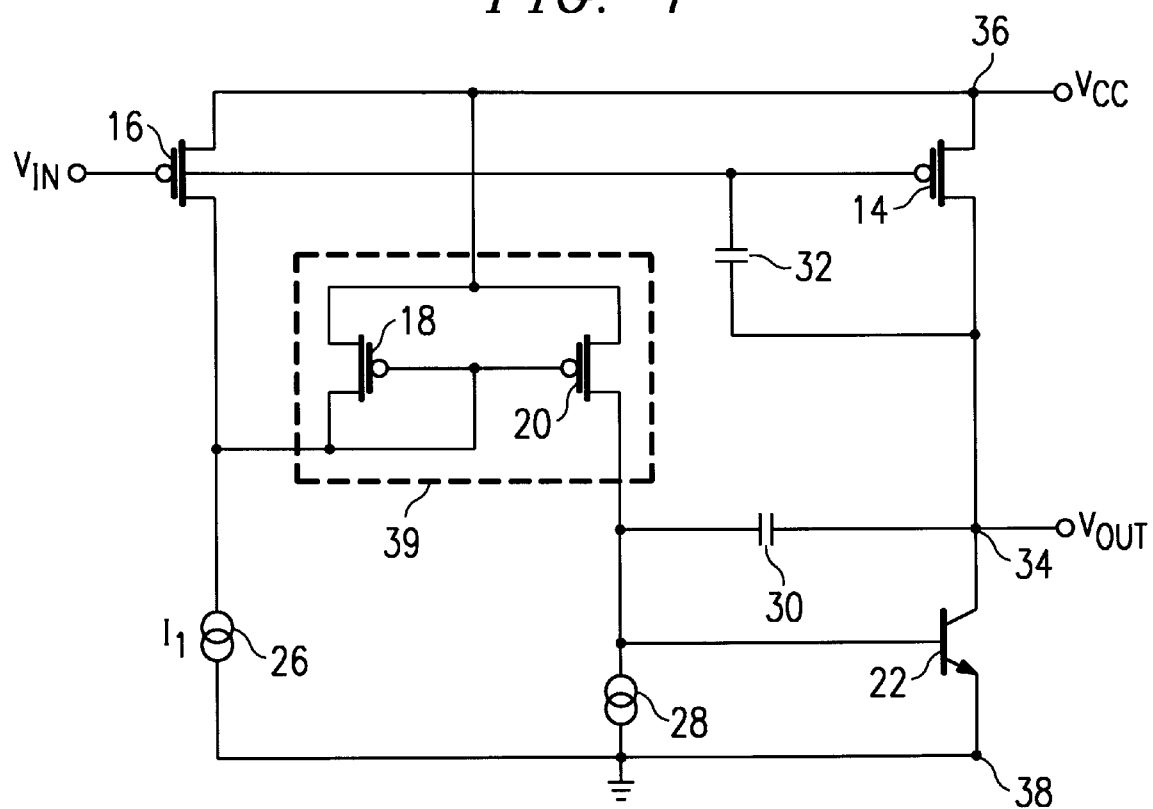
FIG. 1 is a schematic circuit diagram of a preferred embodiment operational amplifier output stage.

FIG. 1 is a circuit schematic illustrating an embodiment of an operational amplifier output stage constructed according to the teachings of the present invention. The circuit of FIG. 1 outputs a voltage to an external load at node 34 that is in the range from approximately the supply voltage $V_{CC}$ to the ground potential. The circuit includes PMOS transistors 14, 16, 18, and 20; NPN transistor 22; current sources 26 and 28; capacitors 30 and 32; source voltage $V_{CC}$; output voltage $V_{OUT}$; and input voltage $V_{IN}$.

Figure 2:
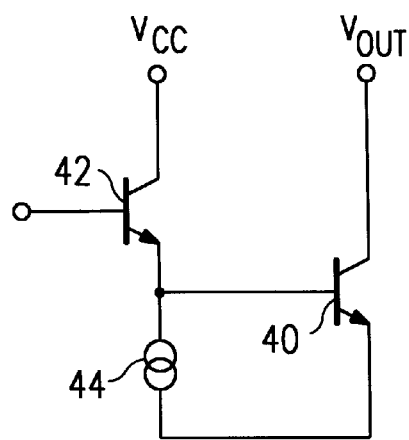
FIG. 2 is a schematic circuit diagram of an NPN Darlington pair for use in the circuit of FIG. 1.

The circuit of FIG. 1 sources current to and sinks current from node 34. The circuit comprises a sourcing transistor 14 and sinking transistor 22. Transistor 22 comprises a single NPN bipolar transistor. Transistor 22 may be replaced by a pair of transistors 40 and 42 coupled in a Darlington pair as shown in FIG. 2, or any other appropriate circuit for providing an output current to node 34. Transistors 40 and 42 are NPN bipolar transistors. The circuit of FIG. 2 also includes current source 44 coupled between the base and emitter of transistor 40. The Darlington pair operates as an NPN with an increased beta.

Transistor 14 comprises a PMOS transistor. The source/drain path of transistor 14 is coupled between the collector of transistor 22 and the power supply node 36. The emitter of transistor 22 is coupled to ground node 38. Transistor 14 is coupled together in a current mirror with transistor 16. Transistor 14 is "B" times larger than transistor 16.

The circuit of FIG. 1 further comprises current mirror circuit 39. Current mirror circuit 39 is operable to control transistor 22. Current mirror circuit 39 comprises current mirror transistors 18 and 20. Current mirror 39 has a gain of "A" where transistor 20 is "A" times bigger than transistor 18. Current sources 26 and 28 are coupled to the current mirror transistors 18 and 20. Current source 26 is coupled between ground node 38 and transistor 18. Current source 28 is coupled between ground node 38 and transistor 20. Current sources 26 and 28 may comprise, for example, appropriately biased transistors in a current mirror. Capacitors 30 and 32 provide compensation for the feedback loops.

In operation, the circuit of FIG. 1 may either source current to output node 34 or sink current from output node 34. In sourcing current to node 34, the input voltage $V_{IN}$ is brought to a lower potential voltage. This causes transistors 14 and 16 to begin to turn "on" and provide current to node 34. As transistor 16 is turned "on", current through current mirror 39 decreases which begins to turn transistor 22 "off". While sourcing current to output node 34, the voltage at output node 34 can rise to approximately equal to the supply voltage $V_{CC}$.

The circuit of FIG. 1 also acts as a current sink to output node 34. To act as a sink, the input voltage $V_{IN}$ is brought to a higher voltage which causes transistors 14 and 16 to begin to turn "off". As transistor 16 begins to turn "off", a portion of current I₁ from current source 26 begins to flow into current mirror 39. This causes transistor 22 to begin to turn "on" and sink current from node 34.

This circuit provides the advantage of using PMOS transistors in place of PNP transistors. For high current applications PNP transistors take up a lot of space on an IC. PMOS transistors are much more compact. The circuit can drive very close to the positive rail and very close to the negative rail with relatively large currents without the circuit requiring any significant quiescent current flow.

Although the present invention has been described in detail, it should be understood that various changes, substitutions and alterations can be made without departing from the spirit and scope of the invention as defined by the appended claims. For example, various NPN and PMOS transistors in FIG. 1 may be changed to PNP and NMOS transistors, respectively. The polarity of the circuit would then be changed to provide an amplifier with a negative voltage output. It is therefore intended that the appended claims encompass any such modifications or embodiments.

What is claimed is:

1. An output stage of an amplifier circuit comprising:
   a sinking bipolar circuit for sinking current from an external load, the sinking bipolar circuit includes a first bipolar transistor and a second bipolar transistor having a base coupled to an emitter of the first bipolar transistor to form a Darlington pair;
   a sourcing MOS transistor for sourcing current to the external load, a source of the MOS transistor coupled to the sinking bipolar circuit to form a common output node;
   a mirroring MOS transistor having a gate coupled to a gate of the sourcing MOS transistor such that current in the sourcing transistor approximately mirrors current in the mirroring transistor; and
   a current mirror circuit responsive to the mirroring transistor and coupled to control current flow through the sinking bipolar circuit.

2. The circuit of claim 1 wherein the sourcing MOS transistor is a PMOS transistor.

3. The circuit of claim 1 wherein the bipolar transistor is an NPN transistor.

4. The circuit of claim 1 wherein the mirroring MOS transistor is a PMOS transistor.

5. The circuit of claim 1 wherein the current mirror circuit comprises:
   a first MOS transistor; and
   a second MOS transistor having a gate coupled to the gate of the first MOS transistor.

6. The circuit of claim 5 further comprising a first current source coupled to the first MOS transistor and a second current source coupled to the second MOS transistor.

7. An output stage of an amplifier circuit comprising:
   a sinking bipolar circuit for sinking current from an external load;
   a sourcing MOS transistor for sourcing current to the external load, a source of the MOS transistor coupled to the sinking bipolar circuit to form a common output node;
   a mirroring MOS transistor having a gate coupled to a gate of the sourcing MOS transistor such that current in the sourcing transistor approximately mirrors current in the mirroring transistor;
   a current mirror circuit responsive to the mirroring transistor and coupled to control current flow through the sinking bipolar circuit; and
   a capacitor coupled between the gate of the sourcing transistor and the source of the sourcing transistor.

8. An output stage of an amplifier circuit comprising:
   a sinking bipolar circuit for sinking current from an external load;
   a sourcing MOS transistor for sourcing current to the external load, a source of the MOS transistor coupled to the sinking bipolar circuit to form a common output node;
   a mirroring MOS transistor having a gate coupled to a gate of the sourcing MOS transistor such that current in the sourcing transistor approximately mirrors current in the mirroring transistor;
   a current mirror circuit responsive to the mirroring transistor and coupled to control current flow through the sinking bipolar circuit; and
   a capacitor coupled between the common output node and the current mirror circuit.

* * * * *

UNITED STATES PATENT AND TRADEMARK OFFICE
CERTIFICATE OF CORRECTION

PATENT NO. : 6,084,477
DATED : July 4, 2000
INVENTOR(S) : Marco Corsi

It is certified that error appears in the above-indentified patent and that said Letters Patent is hereby corrected as shown below:

Cover Page, insert Item [60] under Related U.S. Application Data

--Provisional Application No. 60/036,529  Jan. 30, 1997.--

Signed and Sealed this

Third Day of April, 2001

Attest:

NICHOLAS P. GODICI

*Attesting Officer*   *Acting Director of the United States Patent and Trademark Office*